United States Patent
Su et al.

(10) Patent No.: US 7,554,148 B2
(45) Date of Patent: Jun. 30, 2009

(54) PICK-UP STRUCTURE FOR DRAM CAPACITORS

(75) Inventors: Yi-Nan Su, Taoyuan (TW); Chin-Sheng Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 302 days.

(21) Appl. No.: 11/309,131

(22) Filed: Jun. 27, 2006

(65) Prior Publication Data

US 2007/0296010 A1    Dec. 27, 2007

(51) Int. Cl.
*H01L 27/108* (2006.01)

(52) U.S. Cl. .............................. 257/301; 257/E27.091

(58) Field of Classification Search ................. 257/301, 257/E27.091
See application file for complete search history.

(56) References Cited

U.S. PATENT DOCUMENTS

| | | | |
|---|---|---|---|
| 4,918,502 A * | 4/1990 | Kaga et al. ................. | 257/304 |
| 5,691,550 A * | 11/1997 | Kohyama ................... | 257/301 |
| 6,144,055 A * | 11/2000 | Takenaka ................... | 257/301 |
| 6,316,336 B1 * | 11/2001 | Blanchard ................... | 438/478 |

FOREIGN PATENT DOCUMENTS

TW    I248660    2/2006

* cited by examiner

*Primary Examiner*—Jerome Jackson, Jr.
*Assistant Examiner*—Paul A Budd
(74) *Attorney, Agent, or Firm*—Jianq Chyun IP Office

(57) ABSTRACT

A pick-up structure for DRAM capacitors and a DRAM process are described. A substrate with trenches therein is provided, wherein the trenches include a first trench and the sidewall of each of the trenches is formed with a dielectric layer thereon. A conductive layer is formed on the surfaces of the substrate and the trenches, and then a patterned photoresist layer is formed on the conductive layer filling in the trenches and further covering the first trench. The exposed conductive layer is removed to form bottom electrodes in the trenches, and then the patterned photoresist layer is removed. A capacitor dielectric layer is formed on each bottom electrode, and then top electrodes are formed on the substrate filling up the trenches. A contact is then formed on the bottom electrode in the first trench, electrically connecting the substrate via the bottom electrode.

15 Claims, 10 Drawing Sheets

PICK-UP STRUCTURE FOR DRAM CAPACITORS

BACKGROUND OF THE INVENTION

1. Field of Invention

The present invention relates to a semiconductor structure and its fabrication. More particularly, this invention relates to a pick-up structure for capacitors of DRAM cells and to a DRAM process including the formation of the capacitor pick-up structure.

2. Description of Related Art

There are generally two types of capacitors for DRAM cells, including stacked capacitor and deep-trench (DT) capacitor, wherein the DT capacitor is formed in the substrate and the capacitance thereof can be easily increased by increasing the trench depth, so that much less lateral area is required.

Since the trenches of the trench capacitors are formed quite deep, an N-band is formed quite deep in the substrate to electrically connect the bottom electrodes of all capacitors. To pick up such a deep N-band, in the prior art, multiple ion implantations of different doses and energies are conducted to form a wide deep N-well, and then a contact is formed on the deep N-well as the contact of the N-band.

However, the prior-art method limits the integration degree because the deep N-well requires a certain lateral area even when the memory cell dimension is reduced, and is quite tedious due to the multiple ion implantations. Accordingly, a new pick-up structure for DRAM capacitors is desired to improve the integration degree of DRAM as well as to simplify the DRAM process.

SUMMARY OF THE INVENTION

In view of the foregoing, this invention provides a DRAM process that includes formation of a capacitor pick-up structure without forming a wide deep N-well through multiple ion implantations.

This invention also provides a capacitor pick-up structure for a DRAM array, which includes a dummy capacitor at an edge or a corner of the memory array area as a connector to the doped band so that the integration degree of DRAM is increased.

A DRAM process including formation of a capacitor pick-up structure of this invention is described below. A substrate with multiple trenches therein is provided, wherein the trenches include a first trench and each trench has a dielectric layer on its sidewall. A conductive layer is formed on the surfaces of the substrate and the trenches, and a patterned photoresist layer is formed on the conductive layer filling in the trenches and further covering the first trench. The exposed conductive layer is removed to form multiple bottom electrodes in the trenches, and the patterned photoresist layer is removed. A capacitor dielectric layer is formed on each bottom electrode, and then multiple top electrodes are formed over the substrate filling up the trenches. A contact is then formed on the bottom electrode in the first trench, electrically connecting with the substrate via the bottom electrode.

In the above DRAM process, the first trench may be formed at an edge or a corner of a memory cell array area of the DRAM.

In some embodiments, the top surface of the photoresist layer in each of the trenches other than the first trench is lower than that of the substrate.

In some embodiments, the trenches include multiple pairs of adjacent trenches, and two transistors are formed on the substrate beside each pair of trenches after the top electrodes are formed but before the contact is formed. The DRAM process may further include, after the top electrodes are formed but before the transistors are formed, forming an isolation structure between each pair of trenches after the top electrodes are formed but before the transistors are formed, wherein the isolation structure encroaches upon the pair of trenches. In such cases, the DRAM process may also include forming passing gate structures on the isolation structure during the formation of the transistors.

In addition, the capacitor dielectric layer may include an ONO layer. In an embodiment, the DRAM process further includes a surface treatment to the bottoms of the trenches having the dielectric layer therein before the conductive layer is formed.

The DRAM process may further include forming a doped band in the substrate through dopant diffusion from the bottoms of the trenches, wherein the source of the dopant diffusion may include at least one of an ion implantation done to the bottoms of the trenches before the conductive layer is formed and a doped semiconductor material that constitutes the conductive layer. The doped semiconductor material may include doped poly-Si. An annealing treatment may be conducted to cause dopant diffusion after the conductive layer is formed.

Another DRAM process including formation of a capacitor pick-up structure of this invention is described as follows. A substrate with multiple trenches therein is provided, wherein the trenches include a first trench and each trench has a dielectric layer on its sidewall. A bottom electrode is formed on the internal surface of each trench, and a capacitor dielectric layer is formed on each bottom electrode. The capacitor dielectric layer in the first trench is removed, and multiple top electrodes are formed on the substrate filling up the trenches. A contact is then formed on the top electrode in the first trench, electrically connecting with the substrate via the top electrode and the bottom electrode in the first trench.

In the above DRAM process, the first trench may be formed at an edge or a corner of a memory cell array area of the DRAM.

In some embodiments, the top surface of the bottom electrode in each of the trenches is lower than that of the substrate.

In some embodiments, the trenches include multiple pairs of adjacent trenches, and two transistors are formed on the substrate beside each pair of trenches after the top electrodes are formed but before the contact is formed. The DRAM process may further include, after the top electrodes are formed but before the transistors are formed, forming an isolation structure between each pair of trenches after the top electrodes are formed but before the transistors are formed, wherein the isolation structure encroaches upon the pair of trenches. In such cases, the DRAM process may also include forming passing gate structures on the isolation structure during the formation of the transistors.

In addition, the capacitor dielectric layer may include an ONO layer. In an embodiment, the DRAM process further includes a surface treatment to the bottoms of the trenches having the dielectric layer therein before the conductive layer is formed.

The DRAM process may further include forming a doped band in the substrate through dopant diffusion from the bottoms of the trenches, wherein the source of the dopant diffusion may include at least one of an ion implantation done to the bottoms of the trenches before the conductive layer is formed and a doped semiconductor material that constitutes the conductive layer. The doped semiconductor material may include doped poly-Si. An annealing treatment may be conducted to cause dopant diffusion after the conductive layer is formed.

The capacitor pick-up structure of this invention is applied to a memory cell array area of DRAM that is disposed on a substrate over a doped band in the substrate. The pick-up structure includes a dummy capacitor and a contact thereon. The dummy capacitor is disposed in a first trench in the substrate, wherein the bottom of the first trench exposes a portion of the doped band. The dummy capacitor includes a first bottom electrode on the internal surface of the first trench electrically connecting with the doped band, a first dielectric layer between the first bottom electrode and the sidewall of the first trench, and a first top electrode on the first bottom electrode filling up the first trench. The contact electrically connects with the doped band via the dummy capacitor.

In an embodiment, the capacitor pick-up structure may be disposed at an edge or a corner of the memory cell array area.

In some embodiment, the top surface of the first bottom electrode is higher than or coplanar with that of the substrate, and the contact electrically connects with the first bottom electrode at least. In such cases, the pick-up structure may further include a first capacitor dielectric layer between the first bottom electrode and the first top electrode, wherein the first capacitor dielectric layer may include an ONO layer.

In some embodiments, the top surface of the first bottom electrode is lower than that of the substrate. The contact may be disposed on the first top electrode.

In addition, a memory cell in the above memory cell array may include a transistor on the substrate, a trench capacitor in the substrate beside the transistor, and a conductive layer on the substrate for coupling the transistor with the trench capacitor. The trench capacitor may be disposed in a second trench in the substrate, wherein the bottom of the second trench exposes a portion of the doped band. The trench capacitor may include a second bottom electrode on the internal surface of the second trench electrically connecting with the doped band, a second dielectric layer between the second bottom electrode and the sidewall of the second trench, a second top electrode on the second bottom electrode filling up the second trench, and a second capacitor dielectric layer between the second bottom electrode and the second top electrode. The DRAM may further include an isolation structure that has a portion disposed between every two adjacent trench capacitors and encroaching upon the two adjacent trench capacitors. Passing gate structures may be disposed on the isolation structure.

In some embodiments, the above capacitor pick-up structure may also include an isolation structure that encroaches upon the dummy capacitor, and may further include a passing gate structure on the isolation structure encroaching upon the dummy capacitor.

Since the capacitor pick-up structure utilizes a dummy capacitor as a connector to the doped band deep in the substrate, a wide deep N-well is not required to form and the corresponding multiple ion implantations are not needed. Thus, the integration degree of the DRAM is increased and the DRAM process is simplified.

In order to make the aforementioned and other objects, features and advantages of the present invention comprehensible, a preferred embodiment accompanied with figures is described in detail below.

BRIEF DESCRIPTION OF THE DRAWINGS

FIGS. 2F-2I illustrate, in a cross-sectional view, a DRAM process according to another preferred embodiment of this invention.

DESCRIPTION OF EMBODIMENTS

Figure 1:
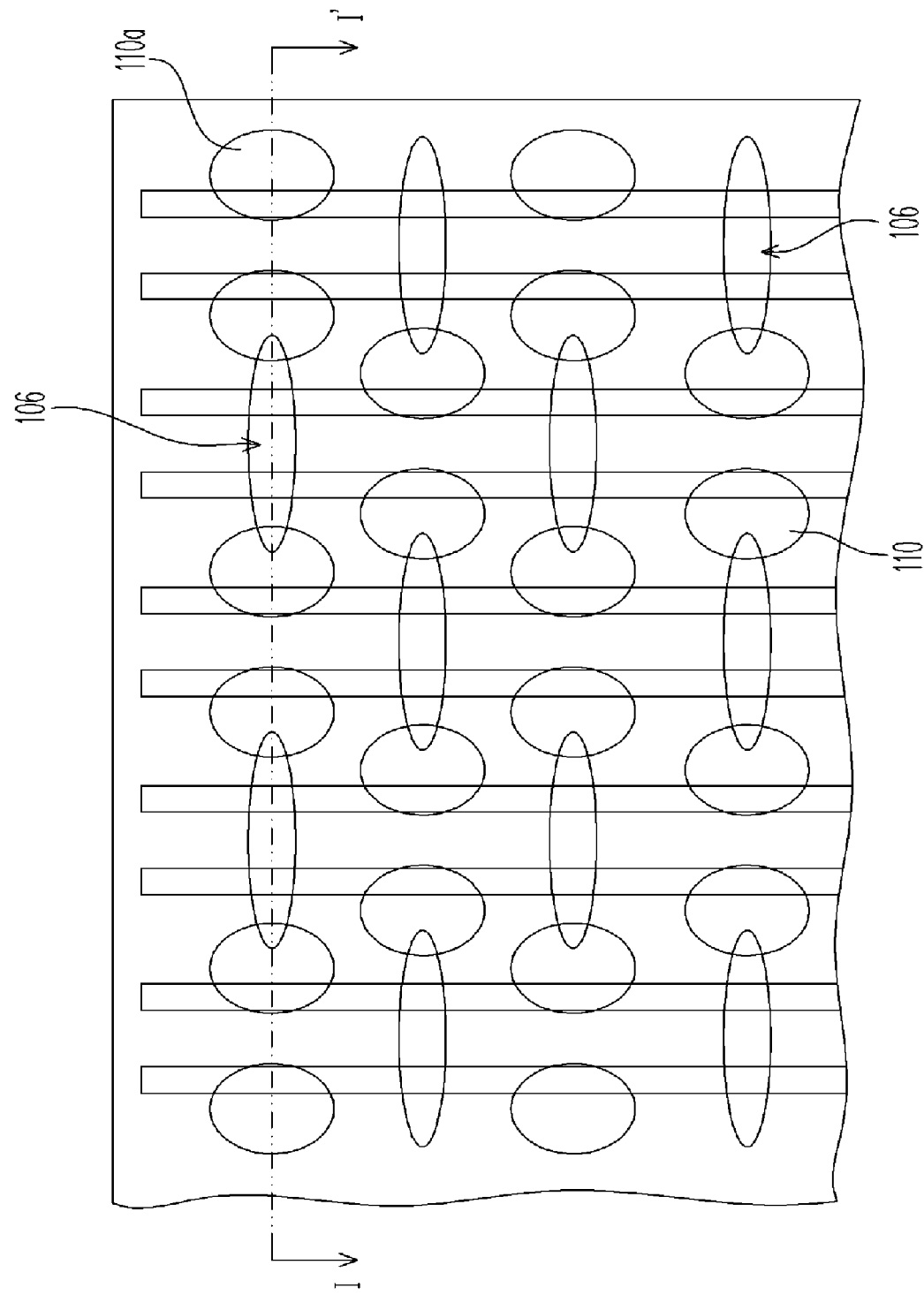
FIG. 1 illustrates a top view of a DRAM layout according to an embodiment of this invention.

FIG. 1 illustrates a top view of a DRAM layout according to an embodiment of this invention. FIGS. 2A-2E illustrate a DRAM process according to a preferred embodiment of this invention.

Figure 2A:
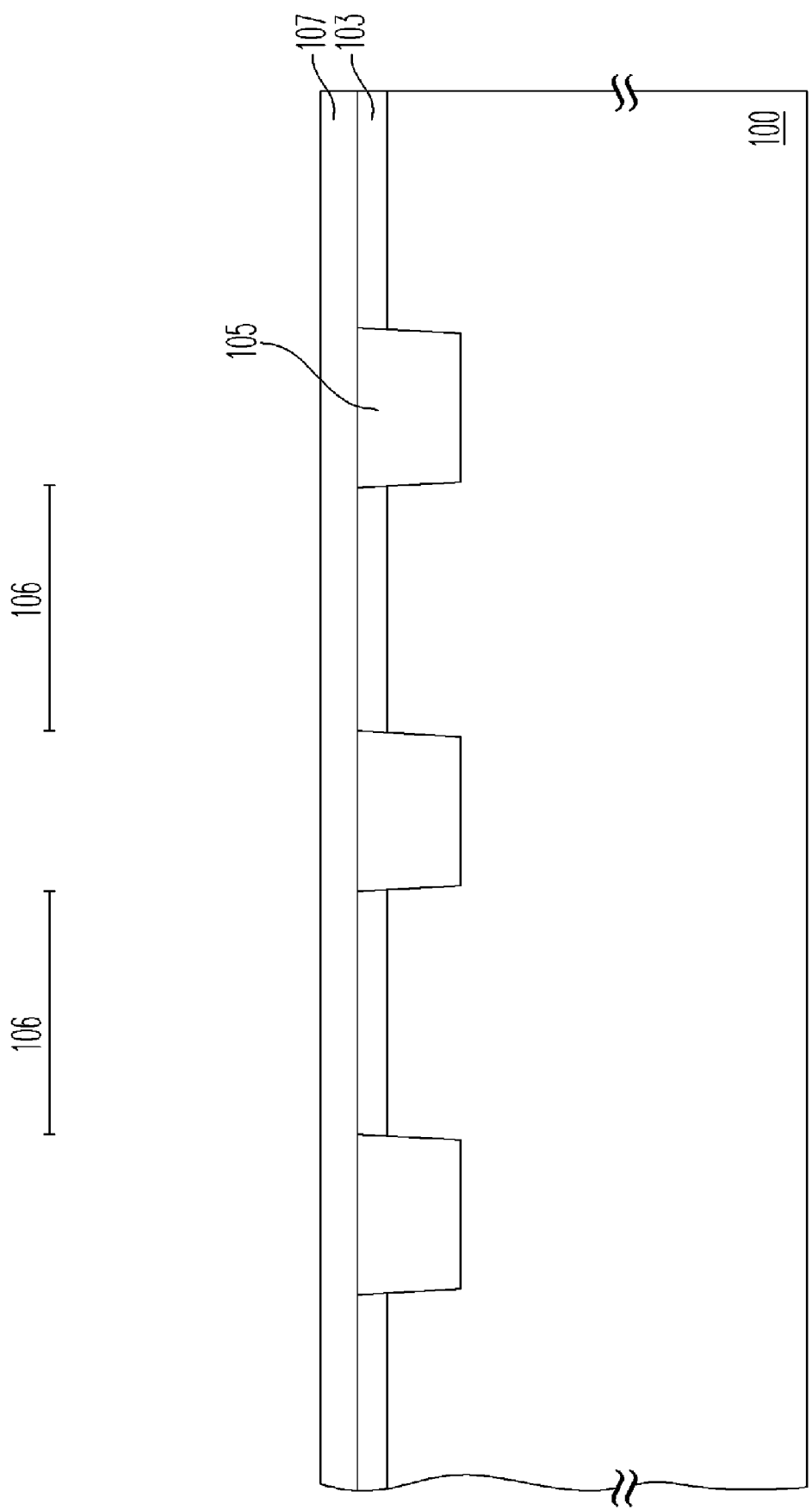
FIGS. 2A-2E illustrate, in a cross-sectional view along the line I-I' in FIG. 1, a DRAM process according to a preferred embodiment of this invention.

Referring to FIGS. 1 and 2A, a substrate 100 like a silicon substrate is provided, and then a hard mask layer 103 is formed on the substrate 100. The hard mask layer 103 may include silicon nitride (SiN) and may be formed through CVD. An isolation structure 105 defining active areas 106 is then formed in the hard mask layer 103 and the substrate 100, possibly being a shallow trench isolation (STI) structure and possibly including silicon oxide. Before the hard mask layer 103 is formed, a pad layer (not shown) may be formed on the substrate 100. The process for forming the pad layer to the isolation structure 105 can be any suitable process having been applied the prior art.

Optionally, another hard mask layer 107 is further formed on the substrate 100 if required, possibly including SiN or SiC and possibly being formed with CVD. The thickness of the hard mask layer 107 may be 800-2000 Å.

Figure 2B:
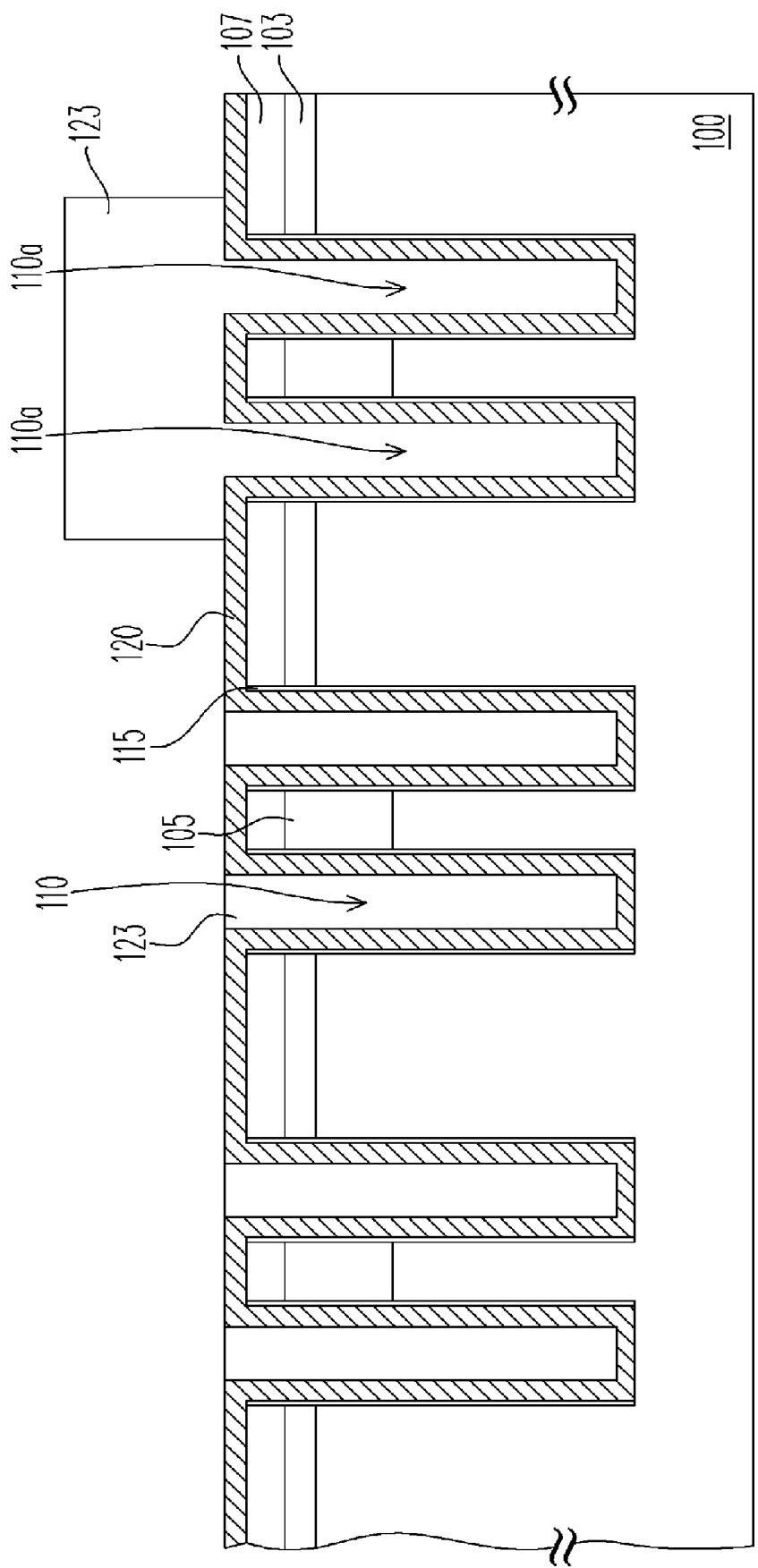

Referring to FIGS. 1 and 2B, multiple trenches 110 are formed in the substrate 100, wherein two adjacent trenches 110 are formed in a pair encroaching upon two side parts of each illustrated portion of the isolation structure 105. Among the trenches 110, the one in which a dummy capacitor as a part of the capacitor pick-up structure will be formed is labeled with "110a". The depth of the trenches 110 is usually 1-3 μm.

A dielectric layer 115 is then formed in each trench 110, possibly including SiO and possibly formed with thermal oxidation or CVD. The dielectric layer 115 at the bottom of each trench 110 is removed to expose the substrate 100 thereat, possibly with anisotropic etching. The thickness of the dielectric layer 115 may be 30-400 Å.

Referring to FIG. 2B again, a conductive layer 120 is formed on the surfaces of the hard mask layer 107, the dielectric layer 115 and the bottoms of the trenches 110. The conductive layer 120 may include doped poly-Si, and may be formed by depositing a layer of undoped poly-Si with CVD and then doping the layer with ion implantation or by depositing a layer of poly-Si with in-situ doping. After that, an annealing treatment is optionally conducted depending on the thermal budget of the process to diffuse the dopant in the conductive layer 120 into the substrate 100 and, as described later, assist the formation of the doped band for connecting all bottom electrodes in the substrate.

It is noted that after a portion of the dielectric layer 115 is removed to expose the bottom of each trench 110 but before the conductive layer 120 is formed, a surface treatment may be conducted to the exposed substrate 100 to reduce the resistance of the surface layer of the substrate 100 at the bottom of each trench 110 and/or enhance the adhesion between the substrate 100 and the conductive layer 120. It is noted that the surface treatment may include a cleaning treatment and/or an ion implantation process. The ion used in the implantation may be arsenic or phosphorous ion, so as to reduce the resistance of the surface layer of the substrate 100 at the bottom of each trench 110 as well as to assist the formation of the doped band for connecting all bottom electrodes.

Referring to FIG. 2B again, a patterned photoresist layer 123 is formed over the substrate 100, filling in each trench 110 and further covering the first trench 110a. The patterned photoresist layer 123 may be formed by applying a photoresist material with spin coating, exposing the same using a reticle with a corresponding pattern thereon and then developing the same. The photoresist material may be one of positive type.

Figure 2C:
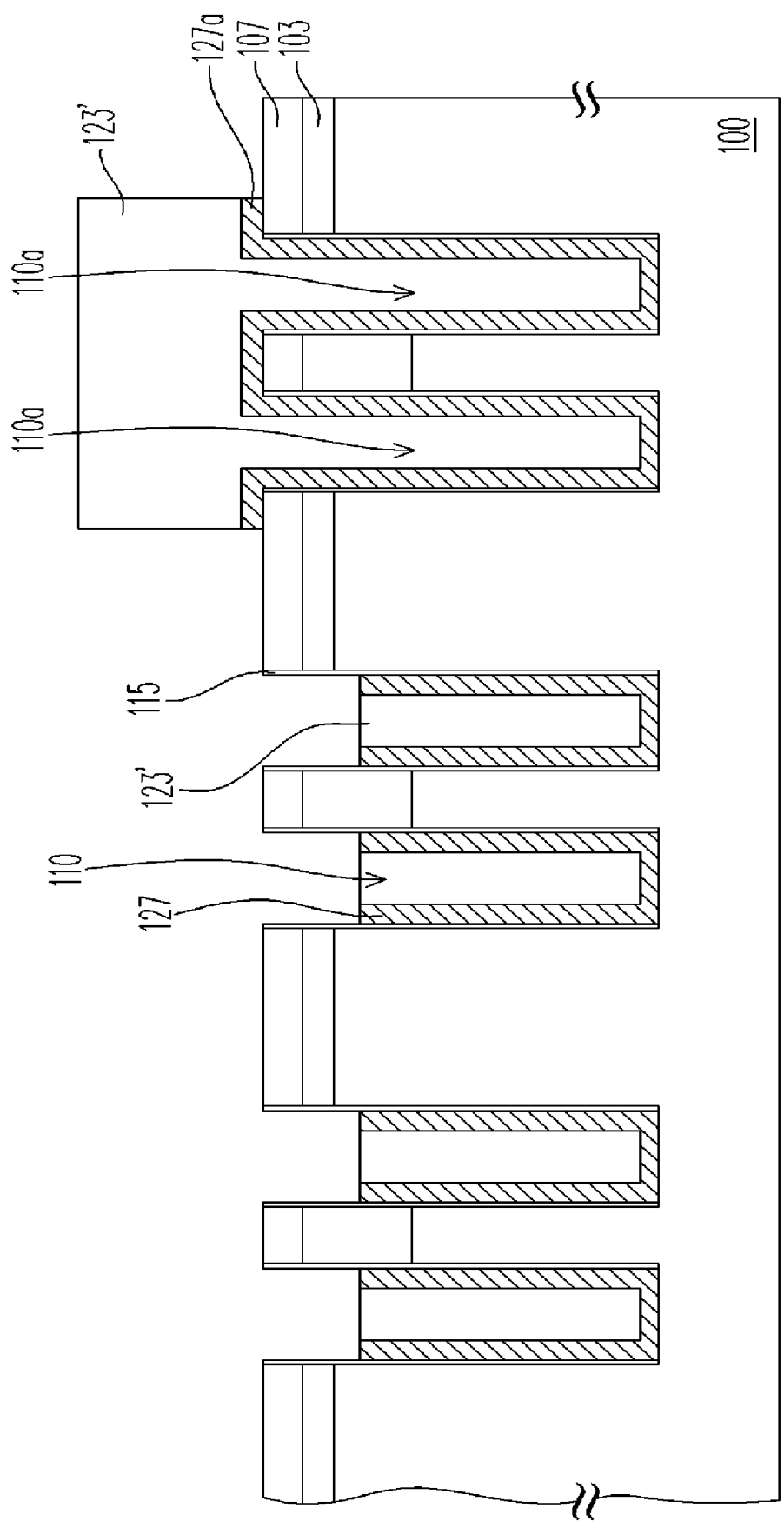

Referring to FIGS. 2B and 2C, the patterned photoresist layer 123 is etched back to remove a portion thereof in each trench 110 other than the trench 110a. Thus, the portion of the remaining photoresist layer 123' in each trench 110 other than the trench 110a has a top surface lower than that of the substrate 100. The conductive layer 120 exposed by the remaining photoresist layer 123' is removed to form multiple bottom electrodes 127 in the trenches 110. The removal may be done with dry etching like reactive ion etching (RIE). Since the patterned photoresist layer 123' covers the trench 110a, the bottom electrode 127a formed in the trench 110a has a shape different from that of the bottom electrode 127 formed in each trench 110 other than the trench 110a.

Figure 2D:
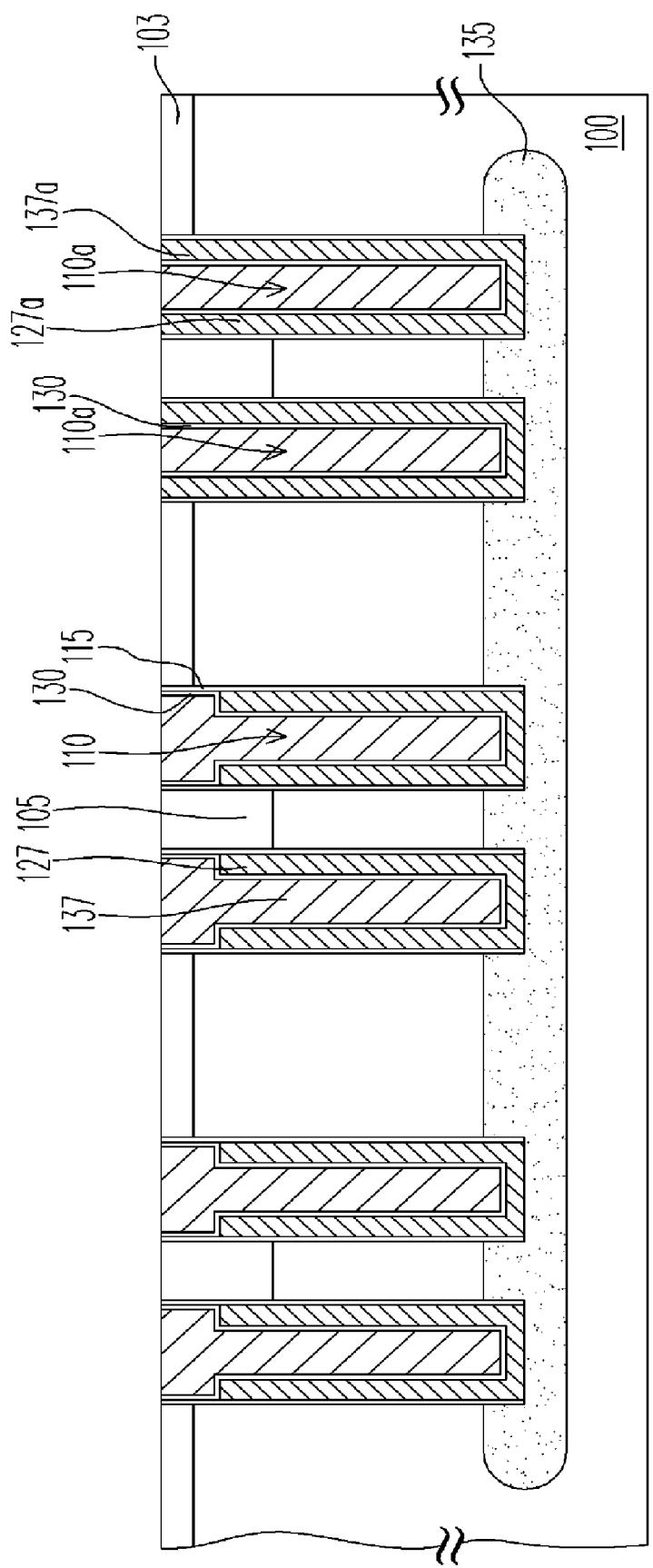

Referring to FIGS. 2C and 2D, the patterned photoresist layer 123' is removed, possibly with plasma ashing and solvent cleaning. A capacitor dielectric layer 130 is then formed over the substrate 100, possibly being an SiO/SiN/SiO (ONO) or SiO/SiN (ON) composite layer. The capacitor dielectric layer 130 may alternatively include a high-k material like $Ta_2O_5$, BST, SiN, SiON, SiC, SiOC, $HfO_2$, $ZrO_2$, $TiO_2$, $CeO_2$, $La_2O_3$, $Al_2O_3$ or a combination thereof, possibly formed through CVD or sputtering.

Referring to FIG. 2D, when the capacitor dielectric layer 130 includes an ONO layer, the dopants in the substrate 100 at the bottoms of the trenches 110 diffuse much during the formation of the ONO layer because of the high process temperature. Thus, a doped band 135 is formed in the substrate 100 through the dopant diffusion. The source of the dopant in the substrate 100 at the bottoms of the trenches 110 may include an ion implantation conducted to the substrate 100 before the conductive layer 120 is formed and/or a doped semiconductor material constituting the bottom electrodes 127(a). When the capacitor dielectric layer 130 dose not include an ONO layer, an extra thermal treatment, such as the aforementioned annealing step conducted after the conductive layer 120 is formed, may be applied to cause sufficient dopant diffusion and form the doped band 135.

Referring to FIG. 2D again, multiple top electrodes 137 are then formed on the substrate 100 filling up the trenches 110. The top surface of the bottom electrode 127a in the trench 110a is not covered by the top electrode 137a, while that of the bottom electrode 127 in each trench 110 other than the trench 110a is covered by a top electrode 137. The bottom electrode 127, the capacitor dielectric layer 130 and the top electrode 137 in each trench 110 other then the trench 110a form a capacitor. The top electrodes 137 may be formed by depositing a layer of a conductive material (not shown) over the substrate and then conduct chemical mechanical polishing (CMP) to remove a portion of the conductive material with the hard mask 103 as a mask. The conductive material may be doped poly-Si, which may be formed through poy-Si CVD with in-situ doping.

Figure 2E:
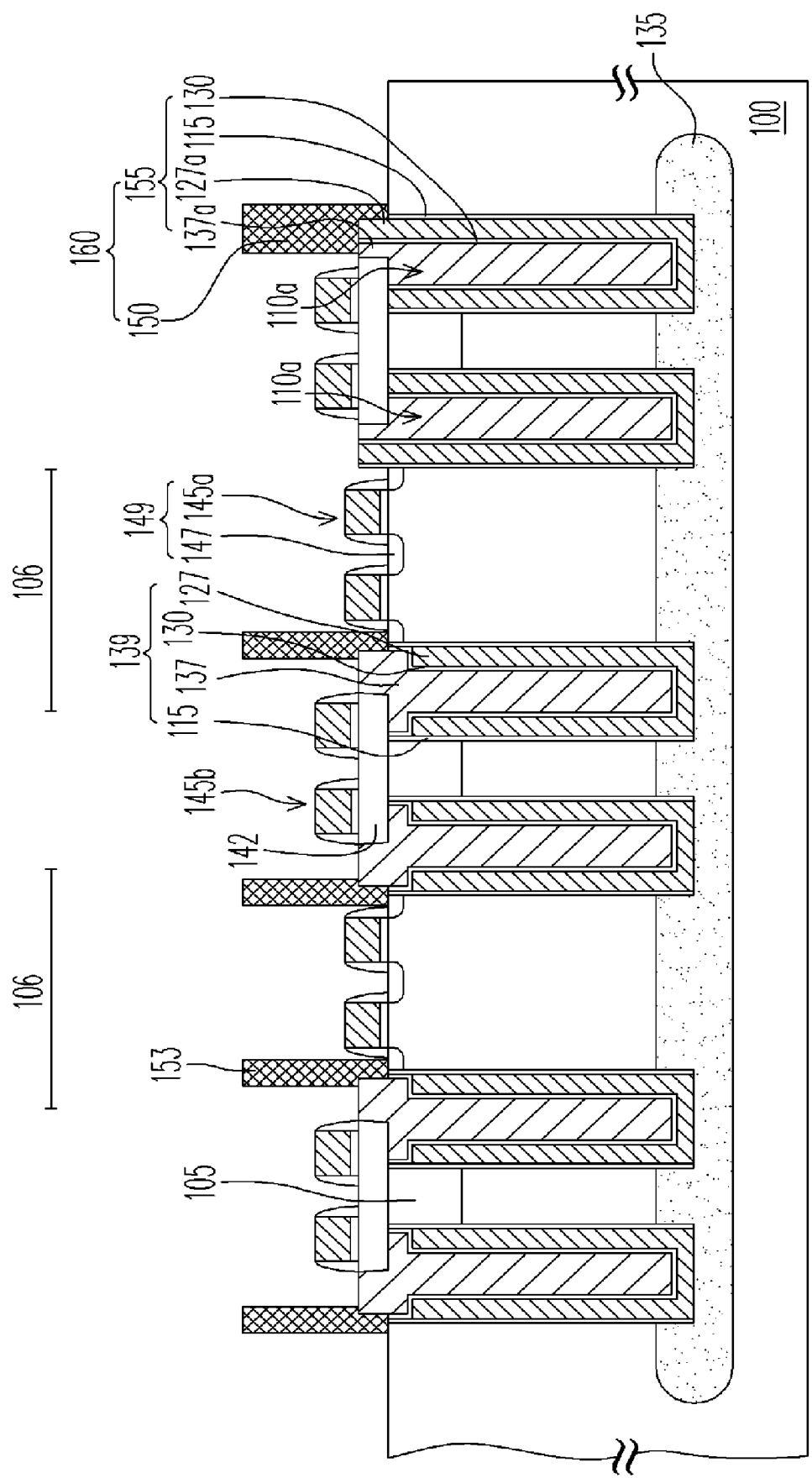

Referring to FIGS. 2D and 2E, an insulating layer 142 is formed between each pair of adjacent trenches 110 as a passing gate isolation structure, encroaching upon the pair of trenches 110. The insulating layer 142 may be formed by the following steps. A portion of the top electrode 137, a portion of the capacitor dielectric layer 130 and a portion of the dielectric layer 115 in each pair of trenches 110 as well as a portion of the isolation structure 105 between each pair of trenches 110 are removed to form trenches, and then the trenches are filled with an insulating material. The insulating material may include SiO, and may be formed through CVD.

Then, the hard mask layer 103 is removed, possibly through dry etching or wet etching. Switching gate structures 145a and passing gate structures 145b are formed respectively on the substrate 100 in the active areas 106 and on the isolation structure 142, while a gate line structure includes many segments as switching gate structures 145a and many segments as passing gate structures 145b that are arranged alternately. Source/drain (S/D) regions 147 are then formed in the substrate 100 in the active areas 106. The process of forming the gate structures 145a and 145b and the S/D regions 147 can be any suitable process having been applied in the prior art.

Referring to FIG. 2E, a contact 150 is then formed on the bottom electrode 127a, picking up (electrically connecting with) the doped band 135 via the bottom electrode 127. The contact 150 is not limited to dispose on the bottom electrode 127a only, and may be disposed in any other manner if only contacting with the bottom electrode 127a. For example, the contact 150 may be disposed on the top electrode 137a, the capacitor dielectric layer 130, the bottom electrode 127a, the dielectric layer 115 and the substrate 100 simultaneously, as shown in FIG. 2E.

It is particularly noted that the contact 150 is formed over the electrode 127a in the trench 110a disposed at an edge or a corner of the memory cell array area and is not electrically connected with any S/D region 147.

Besides, the contact 150 can be formed simultaneously with the conductors 153 each for electrically connecting an S/D region 147 and the top electrode 137 beside the S/D region 147. Alternatively, a bit-line contact (not shown) may be formed on the S/D region 147 between each pair of adjacent gate structures 145a simultaneously with the contact 150. The contact 150, the conductors 153 and the bit line contacts may be formed with any suitable process in the prior art.

It is also noted that though the isolation structure defining the active areas 106 is formed before the capacitor process in the above embodiment, the isolation structure may alternatively be formed after the capacitor process but before the gate process. In the latter case, however, the formation of the overall isolation structure needs only one isolation process rather than the above two isolation processes respectively for forming the isolation structure 105 and the passing gate isolation structures 142.

Since the bottom electrode 127a in the trench 110a is formed with the protection of the patterned photoresist layer 123' covering the trench 110a, the top portion of the bottom electrode 127a is kept and is exposed after the top electrode 137a is formed. Therefore, the doped band 135 can be easily picked up with a contact 150 formed on the bottom electrode 127a without forming a wide deep N-well by multiple implantations. Thereby, the integration degree is increased and the DRAM process is simplified.

Figure 2F:
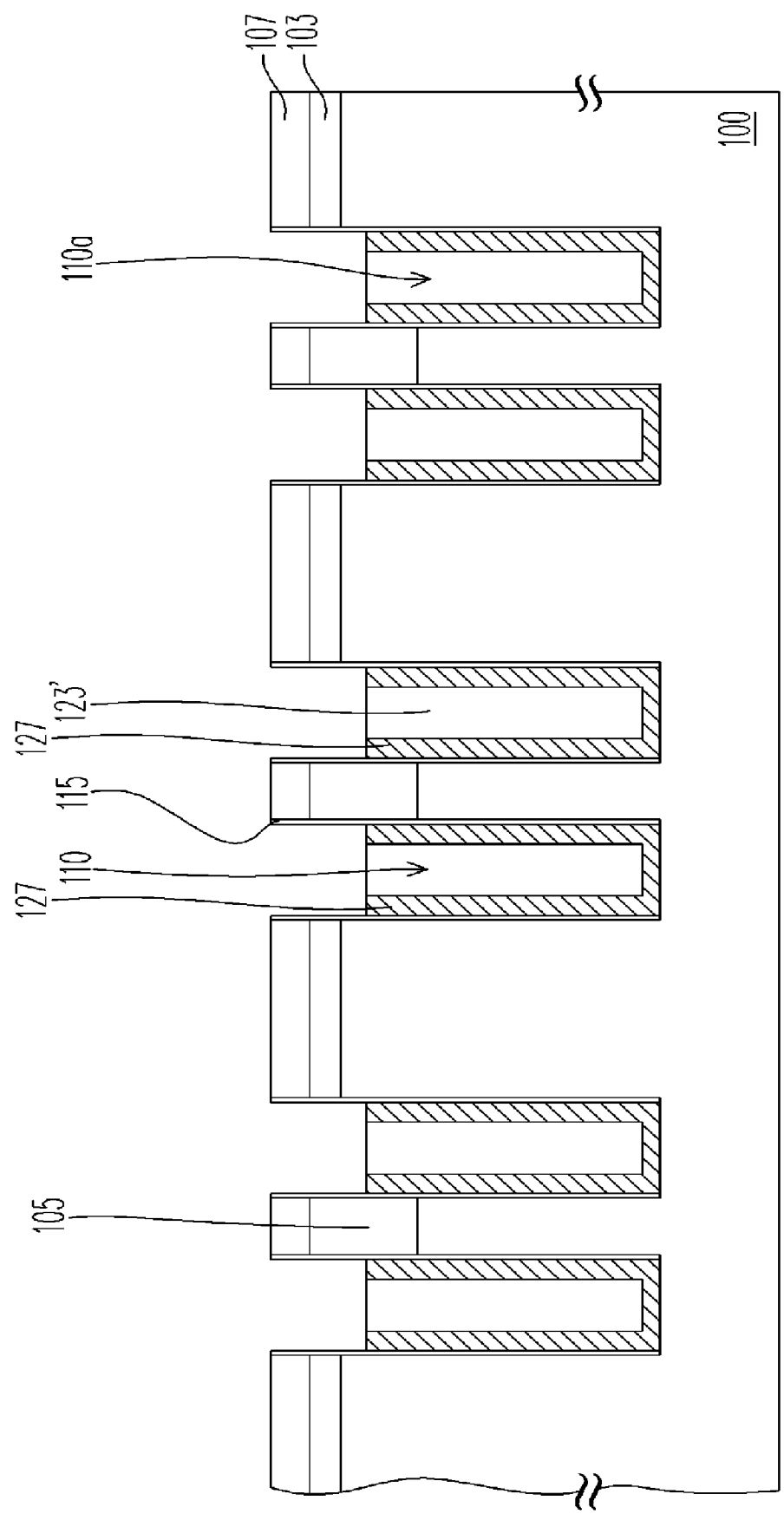

FIGS. 2F-2I illustrate, in a cross-sectional view, a DRAM process according to another preferred embodiment of this invention, wherein the steps corresponding to FIG. 2F follows the steps corresponding to FIG. 2B in the above embodiment.

This embodiment is different from the above one, mainly in that the patterned photoresist layer 123 (FIG. 2B) merely fills in the trench 110a but does not cover the trench 110a to protect the top portion of the bottom electrode 127a for later electrical connection with the contact 150. Instead, at least a portion of the capacitor dielectric layer 130 on the bottom electrode 127a is removed, so that the bottom electrode 127a contacts with the top electrode 137a formed later and is electrically connected with the contact 150 via the top electrode 137a.

Referring to FIG. 2F, the pattern photoresist layer 123' is used as a mask to remove the exposed conductive layer 120 and form a bottom electrode 127(a) in each of the trenches 110 including the trench 110a. The removal method can be the same as above. Since the patterned photoresist layer 123 does not cover the trench 110a, a top portion of the bottom electrode 127a is removed as in the cases of the other bottom electrodes 127.

Figure 2G:
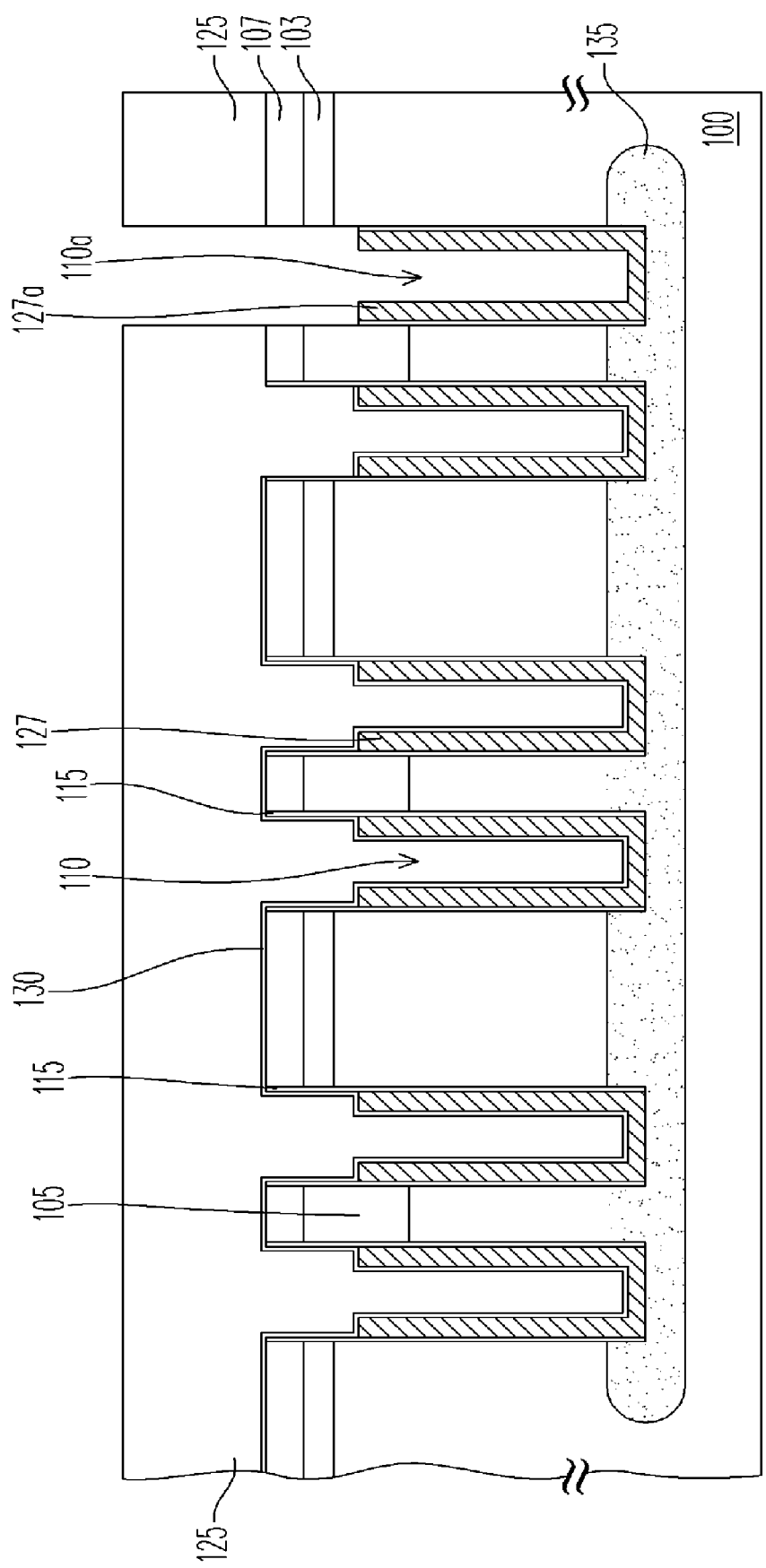

Referring to FIG. 2G, the pattern photoresist layer 123' is removed, possibly with the same method mentioned above. A capacitor dielectric layer 130 is then formed over the substrate 100. Examples of the structure, material and forming method of the capacitor dielectric layer 130 are the same as above. It is particularly noted that when the capacitor dielectric layer 130 includes an ONO layer, the dopants in the bottom electrodes 127 and/or the substrate 100 at the bottoms of the trenches 110 diffuse much during the high-temperature process of the ONO layer to form a doped band 135 in the substrate 100. An extra thermal treatment can be applied to cause sufficient dopant diffusion and form the doped band 135 when the capacitor dielectric layer 130 dose not include an ONO layer.

Referring to FIG. 2G, another patterned photoresist layer 125 is formed over the substrate 100, exposing at least a portion of the capacitor dielectric layer 130 in the trench 110a. The exposed portion of the capacitor dielectric layer 130 is then removed to expose the surface of the bottom electrode 127a in the trench 110a. The removal may include a dry etching process.

Figure 2H:
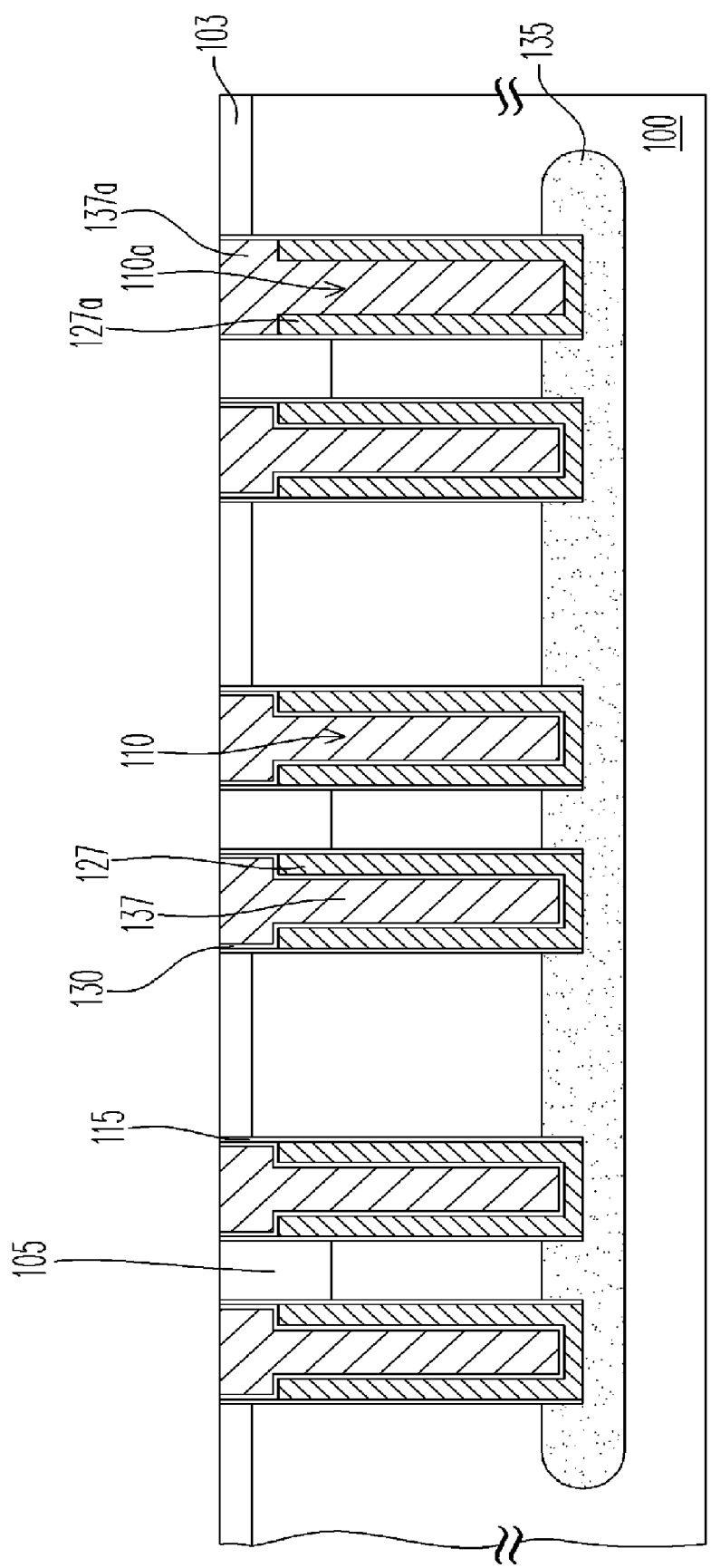
Figure 21:
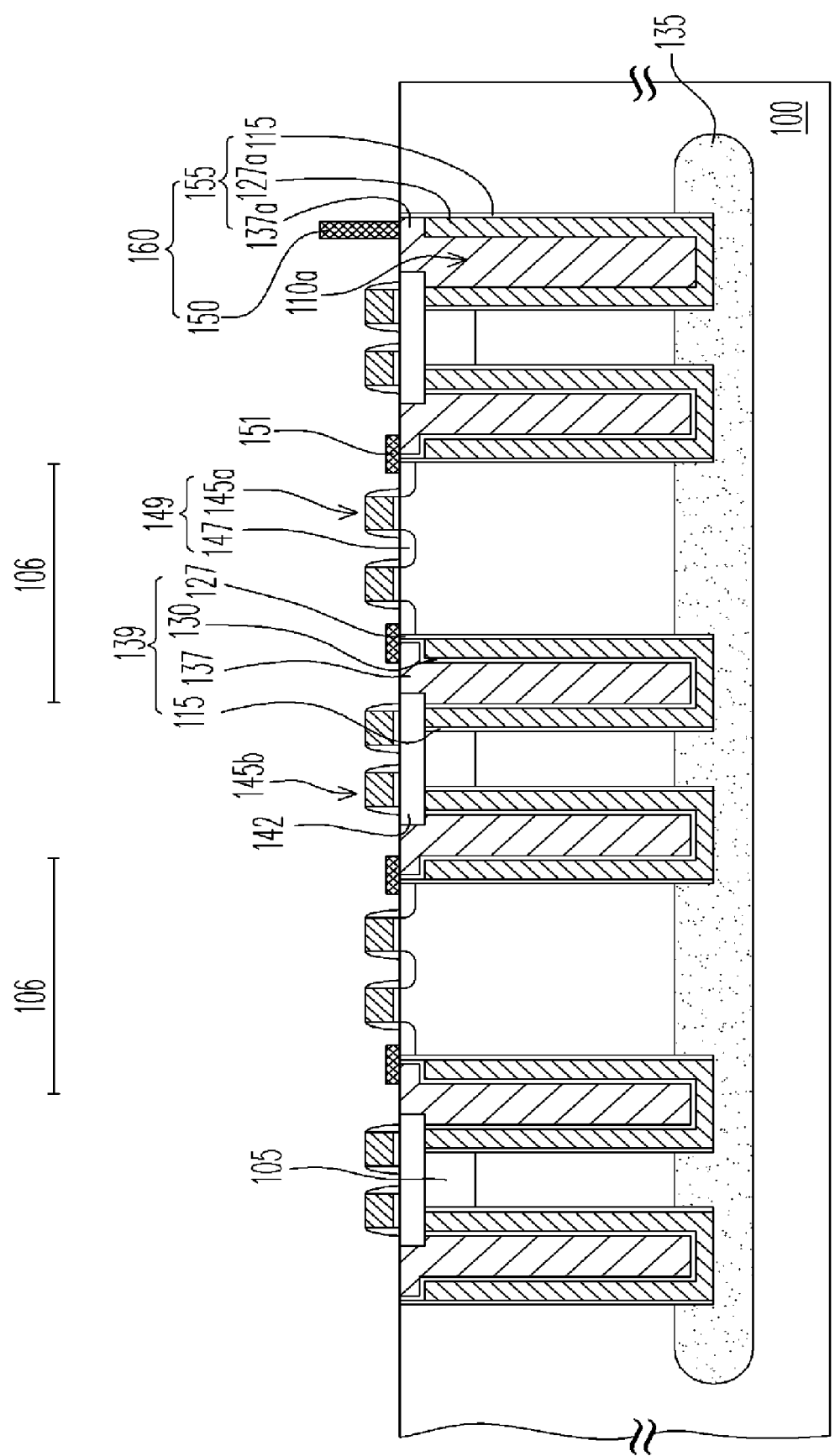

Referring to FIG. 2H, after the patterned photoresist layer 125 is removed, multiple top electrodes 137 are formed on the substrate 100 filling up the trenches 110. Different from the above embodiment, the top surface of the bottom electrode 127(a) in each of the trenches 110 including the trench 110a is covered by a top electrode 137(a) in this embodiment. The bottom electrode 127, the capacitor dielectric layer 130 and the top electrode 137 in each trench 110 other than the trench 110a form a capacitor, while the bottom electrode 127a and the top electrode 137a in the trench 110a contact with each other because the capacitor dielectric layer 130 in the trench 110a has been removed previously. The method for forming the multiple top electrodes 137 can be the same as above.

Referring to FIG. 2I, an insulating layer 142 is formed between each pair of trenches 110 as a passing gate isolation structure, encroaching upon a potion of the pair of trenches 110. The hard mask layer 103 is removed, and switching gate structures 145a and passing gate structures 145b are formed on the substrate 100 in the active area 106 and on the insulating layer 142, respectively, and S/D regions 147 are formed in the substrate 100 in the active areas 106.

Referring to FIG. 2I again, a contact 150 is formed on the top electrode 137a. Since the top electrode 137a and the bottom electrode 127a contact with each other, the contact 150 can electrically connect with the doped band 135 via the top electrode 137a and the bottom electrode 127a. Therefore, the doped band 135 can be picked up by the bottom electrode 127a, the top electrode 137a and the contact 150 without forming a wide deep N-well by multiple ion implantations. Thereby, the integration degree is increased and the DRAM process is simplified.

The capacitor pick-up structure for a memory cell array of DRAM according to this embodiment is described below in reference of FIG. 2I. The memory cell array is disposed on the substrate 100 over the doped band 135. The substrate 100 may be an Si-substrate, and the doped band 135 may be doped with arsenic and/or phosphorous.

The pick-up structure 160 includes a dummy capacitor 155 and a contact 150, the dummy capacitor 155 is disposed in a trench 110a in the substrate 100. The trench 110a exposes a portion of the doped band 135 at the bottom thereof.

The dummy capacitor 155 includes a bottom electrode 127a, a dielectric layer 115 and a top electrode 137a. The bottom electrode 127a is disposed on the internal surface of the trench 110a electrically connecting with the doped band. The dielectric layer 115 is disposed between the bottom electrode 127a and the sidewall of the trench 110a. The top electrode 137a covers the bottom electrode 127a and fills up the trench 110a. The material of the top electrode 137a and the bottom electrode 127a and that of the dielectric layer 115 may be the same as above.

The contact 150 is on the dummy capacitor 155. Since the top electrode 137a and the bottom electrode 127a contact with each other, the contact 150 can electrically connect with the doped band 135 via the top electrode 137a and the bottom electrode 127a. The material of the contact 150 may be doped poly-Si.

On the other hand, each memory cell in the memory cell array area may include a transistor 149, a trench capacitor 139 and a conductor 151, wherein the transistor 149 is disposed on the substrate 100 and the trench capacitor 139 in the substrate 100 beside the transistor 149, and the conductive layer 151 is on the substrate 100 for coupling the transistor 149 with the trench capacitor 139.

The trench capacitor 139 is disposed in a trench 110, and may include a bottom electrode 127, a dielectric layer 115, a top electrode 137 and a capacitor dielectric layer 130, whose materials may be the same as above. Examples of the structure and the forming method of the capacitor dielectric layer 130 are also the same as above.

The transistor 149 may include a gate structure 145a and S/D regions 147, wherein each transistor 149 has one S/D region 147 electrically connected with the top electrode 137 of the corresponding trench capacitor 139 via the conductor 151. The S/D regions 147 may be doped with arsenic and/or phosphorous In this embodiment, the conductor 151 may be a film thinner than the contact 150, and may have a small thickness if only the trench capacitor 139 and the transistor 149 can be coupled. In other embodiment, the conductors 151 may be formed simultaneously with the contact 150 and has the same thickness of the contact 150 like the conductors 153 in FIG. 2E.

The above DRAM further includes an isolation structure 105 that defines the active areas 106 and has a portion between each pair of trench capacitors 139, while the transistors 149 are disposed on the substrate 100 in the active areas 106. An insulating layer 142 as a passing gate isolation structure may be further disposed on the portion of the isolation structure 105 between each pair of trench capacitors 139, encroaching upon the pair of trench capacitors 139. The material of the isolation structure 142 may be SiO. The isolation structure 142 is disposed with passing gate structures 145b thereon. In other embodiments where the isolation structure for defining the active areas 106 is formed after the trench capacitors 139 are formed, the isolation structure also has a portion disposed between each pair of trench capacitors 139 and encroaching upon the pair of trench capacitors 139. Thus, an insulating layer (142) merely as a passing gate isolation structure is not required to form, and the passing gate structures 145*b* over each pair of trench capacitors 139 are formed directly on the isolation structure defining the active areas 106.

It is noted that the trench 110*a* is disposed at an edge or a corner of the memory cell array area, as shown in FIG. 1. In the prior art, the trench capacitor formed in such a trench is coupled to no transistor and has no function. However, this invention modifies the structure of this edge/corner trench capacitor to be a pick-up structure, so that a wide deep N-well is not required to form and a large lateral area is saved.

In other embodiments, the dummy capacitor 155 may have some variations in the structure. Referring to the embodiment of FIG. 2E, the top electrode 137*a* does not cover a top portion of the bottom electrode 127*a* so that the contact 150 can electrically connect with the doped band 135 via the bottom electrode 127*a*, while a capacitor dielectric layer 130 may be further disposed between the bottom electrode 127*a* and the top electrodes 137*a*.

It is also noted that the structure of DRAM with trench capacitors is known to have numerous variations, and the above-mentioned DRAM processes and structures are not intended to limit the scope of this invention.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A capacitor pick-up structure, applied to a memory cell array area of a DRAM that is disposed on a substrate over a doped band in the substrate, and comprising:
    a dummy capacitor in a first trench in the substrate, wherein a bottom of the first trench exposes a portion of the doped band, the dummy capacitor comprising:
        a first bottom electrode on an internal surface of the first trench, electrically connecting with the doped band;
        a first dielectric layer between the first bottom electrode and a sidewall of the first trench; and
        a first top electrode on the first bottom electrode, filling up the first trench; and
    a contact over the substrate, electrically connecting with the doped band via the dummy capacitor.

2. The capacitor pick-up structure of claim 1, which is disposed at an edge of the memory cell array area.

3. The capacitor pick-up structure of claim 1, which is disposed at a corner of the memory cell array area.

4. The capacitor pick-up structure of claim 1, wherein a top surface of the first bottom electrode is higher than or coplanar with a top surface of the substrate.

5. The capacitor pick-up structure of claim 4, wherein the contact electrically connects with the first bottom electrode at least.

6. The capacitor pick-up structure of claim 4, further comprising a first capacitor dielectric layer between the first bottom electrode and the first top electrode.

7. The capacitor pick-up structure of claim 6, wherein the first capacitor dielectric layer comprises an ONO layer.

8. The capacitor pick-up structure of claim 1, wherein a top surface of the first bottom electrode is lower than a top surface of the substrate.

9. The capacitor pick-up structure of claim 8, wherein the contact is disposed on the first top electrode.

10. The capacitor pick-up structure of claim 1, wherein a memory cell in the memory cell array area comprises:
    a transistor on the substrate;
    a trench capacitor in the substrate beside the transistor; and
    a conductive layer on the substrate for coupling the transistor with the trench capacitor.

11. The capacitor pick-up structure of claim 10, wherein the trench capacitor is disposed in a second trench in the substrate, a bottom of the second trench exposes a portion of the doped band, and the trench capacitor comprises:
    a second bottom electrode on an internal surface of the second trench, electrically connecting with the doped band;
    a second dielectric layer between the second bottom electrode and a sidewall of the second trench;
    a second top electrode on the second bottom electrode, filling up the second trench; and
    a second capacitor dielectric layer between the second bottom electrode and the second top electrode.

12. The capacitor pick-up structure of claim 10, wherein the DRAM further comprises an isolation structure that has a portion disposed between every two adjacent trench capacitors and encroaching upon the two adjacent trench capacitors.

13. The capacitor pick-up structure of claim 12, wherein the DRAM further comprises passing gate structures on the isolation structure.

14. The capacitor pick-up structure of claim 1, further comprising an isolation structure that encroaches upon the dummy capacitor.

15. The capacitor pick-up structure of claim 14, wherein the DRAM further comprises a passing gate structure on the isolation structure that encroaches upon the dummy capacitor.

* * * * *